US011049976B2

(12) United States Patent
Ueno et al.

(10) Patent No.: US 11,049,976 B2
(45) Date of Patent: Jun. 29, 2021

(54) THIN-FILM TRANSISTOR, OXIDE SEMICONDUCTOR FILM, AND SPUTTERING TARGET

(71) Applicant: ULVAC, INC., Kanagawa (JP)

(72) Inventors: Mitsuru Ueno, Kanagawa (JP); Junya Kiyota, Kanagawa (JP); Motoshi Kobayashi, Kanagawa (JP); Masaki Takei, Kanagawa (JP); Kazutoshi Takahashi, Kanagawa (JP); Koji Hidaka, Kanagawa (JP); Yuu Kawagoe, Kanagawa (JP); Kentarou Takesue, Kanagawa (JP); Masaru Wada, Kanagawa (JP)

(73) Assignee: ULVAC, INC., Kanagawa (JP)

( * ) Notice: Subject to any disclaimer, the term of this patent is extended or adjusted under 35 U.S.C. 154(b) by 0 days.

(21) Appl. No.: 15/777,081

(22) PCT Filed: Nov. 22, 2016

(86) PCT No.: PCT/JP2016/084539
§ 371 (c)(1),
(2) Date: May 17, 2018

(87) PCT Pub. No.: WO2017/090584
PCT Pub. Date: Jun. 1, 2017

(65) Prior Publication Data
US 2018/0337285 A1 Nov. 22, 2018

(30) Foreign Application Priority Data
Nov. 25, 2015 (JP) .............................. JP2015-229380

(51) Int. Cl.
*H01L 29/786* (2006.01)
*C23C 14/08* (2006.01)
(Continued)

(52) U.S. Cl.
CPC .......... *H01L 29/7869* (2013.01); *C23C 14/08* (2013.01); *C23C 14/083* (2013.01);
(Continued)

(58) Field of Classification Search
CPC ............... H01L 29/7869; H01L 29/786; H01L 27/1251; H01L 29/4908; C23C 14/086
See application file for complete search history.

(56) References Cited

U.S. PATENT DOCUMENTS

2010/0276688 A1 11/2010 Yano et al.
2013/0140175 A1 6/2013 Yano et al.
(Continued)

FOREIGN PATENT DOCUMENTS

CN 101911303 A 12/2010
CN 101911303 B 3/2013
(Continued)

OTHER PUBLICATIONS

International Search Report in International Application No. PCT/JP2016/084539, filed Nov. 22, 2016.
(Continued)

*Primary Examiner* — Julia Slutsker
(74) *Attorney, Agent, or Firm* — Saliwanchik, Lloyd & Eisenschenk

(57) ABSTRACT

A thin-film transistor according to an embodiment of the present invention includes: a gate electrode; an active layer formed of an oxide containing indium, zinc, and titanium; a gate insulating film formed between the gate electrode and the active layer; and a source electrode and a drain electrode that are electrically connected to the active layer. Atomic proportions of elements relative to the total quantity of indium, zinc, and titanium that constitute the oxide may be not less than 24 at. % and not more than 80 at. % for indium, not less than 16 at. % and not more than 70 at. % for zinc, (Continued)

and not less than 0.1 at. % and not more than 20 at. % for titanium.

1 Claim, 5 Drawing Sheets

(51) Int. Cl.
  *H01L 21/02* (2006.01)
  *C23C 14/34* (2006.01)
  *H01L 29/66* (2006.01)
  *H01J 37/34* (2006.01)

(52) U.S. Cl.
  CPC ........ *C23C 14/086* (2013.01); *C23C 14/3414* (2013.01); *H01J 37/3429* (2013.01); *H01L 21/02422* (2013.01); *H01L 21/02488* (2013.01); *H01L 21/02554* (2013.01); *H01L 21/02565* (2013.01); *H01L 21/02631* (2013.01); *H01L 29/66969* (2013.01)

(56) References Cited

U.S. PATENT DOCUMENTS

| | | | |
|---|---|---|---|
| 2013/0270109 A1 | 10/2013 | Morita et al. | |
| 2013/0313548 A1 | 11/2013 | Yano et al. | |
| 2014/0138675 A1* | 5/2014 | Yamazaki | H01L 29/4908 257/43 |
| 2014/0206133 A1* | 7/2014 | Koezuka | H01L 29/66969 438/99 |
| 2014/0246675 A1* | 9/2014 | Imamura | H01L 29/7869 257/43 |
| 2016/0211384 A1 | 7/2016 | Ahn et al. | |
| 2016/0233250 A1* | 8/2016 | Yan | H01L 29/66969 |
| 2016/0315198 A1* | 10/2016 | Inoue | H01L 29/66969 |
| 2017/0125122 A1* | 5/2017 | Miyake | H01L 27/124 |
| 2018/0114855 A1* | 4/2018 | Yamazaki | H01L 29/7869 |

FOREIGN PATENT DOCUMENTS

| | | |
|---|---|---|
| CN | 103270602 A | 8/2013 |
| JP | 2009-031750 A | 2/2009 |
| JP | 2011-216574 A | 10/2011 |
| JP | 2011-222557 A | 11/2011 |
| JP | 2012-151469 A | 8/2012 |
| JP | 2014-175503 A | 9/2014 |
| JP | 2012-054335 A | 3/2021 |
| WO | WO-2009/081885 A1 | 7/2009 |
| WO | WO-2010/092810 A1 | 8/2010 |
| WO | WO-2012/029455 A1 | 3/2012 |

OTHER PUBLICATIONS

Office Action dated Aug. 30, 2018 in Taiwanese Application No. 105138866.

Office Action dated Jul. 28, 2020 in Chinese Application No. 201680063644.2.

Office Action dated Nov. 6, 2020 in Japanese Application No. 2019-174513, along with its English translation.

* cited by examiner

THIN-FILM TRANSISTOR, OXIDE SEMICONDUCTOR FILM, AND SPUTTERING TARGET

CROSS-REFERENCE TO RELATED APPLICATIONS

This application is the U.S. national stage application of International Patent Application No. PCT/JP2016/084539, filed Nov. 22, 2016, which claims priority to Japanese Application No. 2015-229380, filed Nov. 25, 2015, the disclosures of each of which are incorporated herein by reference in their entirety.

TECHNICAL FIELD

The present invention relates to a thin-film transistor including an active layer formed of an oxide semiconductor, to an oxide semiconductor film, and to a sputtering target.

BACKGROUND ART

A thin-film transistor (TFT) using an In—Ga—Zn—O-based oxide semiconductor film (IGZO) as an active layer has been widely applied to various displays in recent years because it is capable of achieving a mobility higher than that of an existing TFT using an amorphous silicon film as active layer (see, for example, Patent Literatures 1 to 3).

For example, Patent Literature 1 discloses an organic EL display apparatus in which an active layer of a TFT driving an organic EL device is formed of IGZO. Patent Literature 2 discloses a thin-film transistor in which a channel layer (active layer) is formed of a-IGZO and the mobility of not less than 5 cm$^2$/Vs. Further, Patent Literature 3 discloses a thin-film transistor in which an active layer is formed of IGZO and the on/off current ratio is not less than five digits.

Patent Literature 1: Japanese Patent Application Laid-open No. 2009-31750
Patent Literature 2: Japanese Patent Application Laid-open No. 2011-216574
Patent Literature 3: WO2010/092810

SUMMARY OF INVENTION

Problem to be Solved by the Invention

In recent years, because of the demand for high resolution, low power consumption, and high frame rate in various displays, the demand for an oxide semiconductor exhibiting a higher mobility is growing. However, since the thin-film transistor using IGZO as an active layer is difficult to obtain a mobility higher than 10 cm$^2$/Vs, development of materials for use in a thin-film transistor having a higher mobility is desirable.

In view of the circumstances as described above, it is an object of the present invention to provide a high-performance thin-film transistor instead of IGZO, an oxide semiconductor film used for an active layer thereof, and a sputtering target used for depositing the same.

Means for Solving the Problem

In order to achieve the above-mentioned object, a thin-film transistor according to an embodiment of the present invention includes: a gate electrode; an active layer formed of an oxide semiconductor film containing indium, zinc, and titanium; a gate insulating film formed between the gate electrode and the active layer; and a source electrode and a drain electrode that are electrically connected to the active layer.

The thin-film transistor uses, as an active layer, an oxide semiconductor film obtained by adding an oxide containing titanium to an oxide containing indium and an oxide containing zinc.

Atomic proportions of elements relative to the total quantity of indium, zinc, and titanium that constitute the oxide semiconductor film may be not less than 24 at. % and not more than 80 at. % for indium, not less than 16 at. % and not more than 70 at. % for zinc, and not less than 0.1 at. % and not more than 20 at. % for titanium.

Accordingly, it is possible to achieve transistor characteristics of a mobility of not less than 15 cm$^2$/Vs and an on/off current ratio of eight not less than eight digits.

Further, the atomic proportions of the elements may be not less than 39.5 at. % and not more than 56.5 at. % for indium, not less than 39 at. % and not more than 56 at. % for zinc, and not less than 0.5 at. % and not more than 10 at. % for titanium.

Accordingly, it is possible to achieve transistor characteristics of a mobility of not less than 28 cm$^2$/Vs and an on/off current ratio of eight not less than 10 digits.

An oxide semiconductor film according to an embodiment of the present invention is formed of an oxide containing indium, zinc, and titanium.

Accordingly, it is possible to form an active layer of a thin-film transistor, which has transistor characteristics of a mobility of not less than 15 cm$^2$/Vs and an on/off current ratio of eight not less than eight digits.

Atomic proportions of elements relative to the total quantity of indium, zinc, and titanium that constitute the oxide may be not less than 24 at. % and not more than 80 at. % for indium, not less than 16 at. % and not more than 70 at. % for zinc, and not less than 0.1 at. % and not more than 20 at. % for titanium.

Further, the atomic proportions of the elements may be not less than 39.5 at. % and not more than 56.5 at. % for indium, not less than 39 at. % and not more than 56 at. % for zinc, and not less than 0.5 at. % and not more than 10 at. % for titanium.

The oxide semiconductor film may have a carrier concentration of not more than 1×10$^{17}$/cm$^3$.

Accordingly, it is possible to achieve transistor characteristics of a mobility of not less than 15 cm$^2$/Vs and an on/off current ratio of eight not less than eight digits.

A sputtering target according to an embodiment of the present invention is formed of a sintered body of oxides of indium, zinc, and titanium.

Accordingly, it is possible to deposit an active layer of a thin-film transistor, which has transistor characteristics of a mobility of not less than 15 cm$^2$/Vs and an on/off current ratio of eight not less than eight digits.

Atomic proportions of elements relative to the total quantity of indium, zinc, and titanium that constitute the sintered body may be not less than 24 at. % and not more than 80 at. % for indium, not less than 16 at. % and not more than 70 at. % for zinc, and not less than 0.1 at. % and not more than 20 at. % for titanium.

Further, the atomic proportions of the elements may be not less than 39.5 at. % and not more than 56.5 at. % for indium, not less than 39 at. % and not more than 56 at. % for zinc, and not less than 0.5 at. % and not more than 10 at. % for titanium.

Advantageous Effects of Invention

As described above, according to the present invention, it is possible to provide a high-performance thin-film transistor instead of IGZO. Further, it is possible to provide an oxide semiconductor film used for an active layer of the thin-film transistor. Further, it is possible to provide a sputtering target used for depositing the oxide semiconductor film.

MODE(S) FOR CARRYING OUT THE INVENTION

Hereinafter, an embodiment of the present invention will be described with reference to the drawings.

Figure 1:
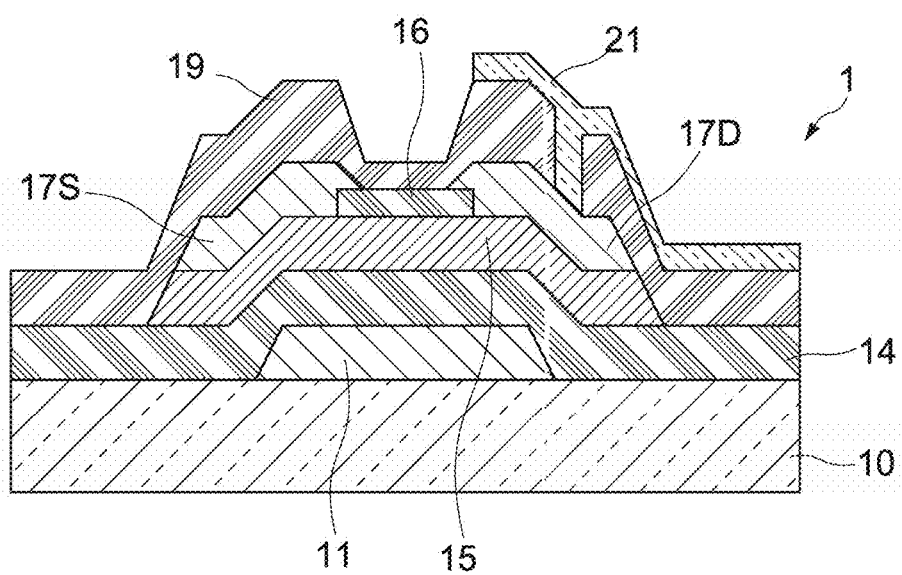
FIG. 1 A schematic cross-sectional view showing a configuration of a thin-film transistor according to an embodiment of the present invention.
Figure 2A:
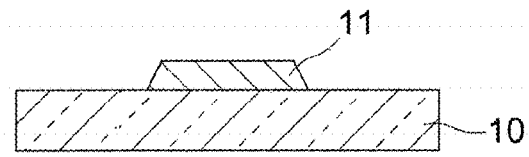
FIGS. 2A-2E Process cross-sectional views each describing a step of a method of producing the thin-film transistor.
Figure 2B:
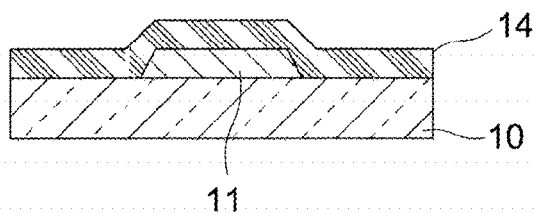
Figure 2C:
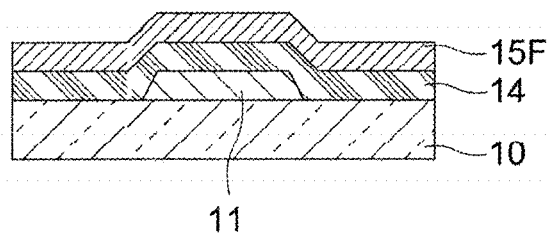
Figure 2D:
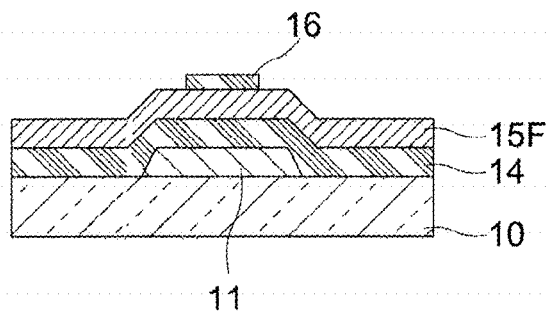
Figure 2E:
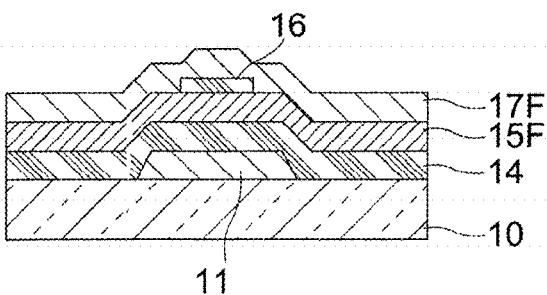
Figure 3A:
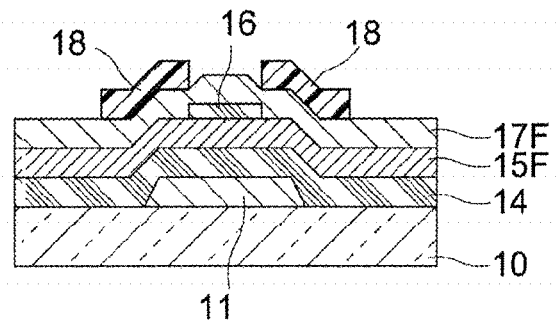
FIGS. 3A-3D Process cross-sectional views each describing a step of a method of producing the thin-film transistor.
Figure 3B:
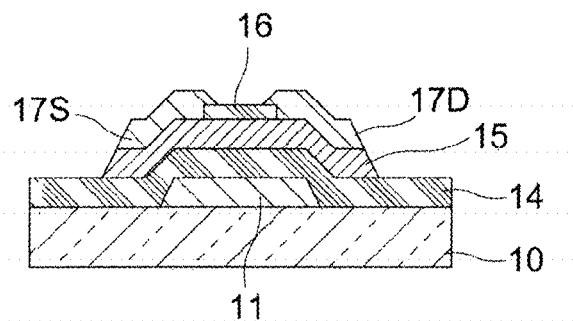
Figure 3C:
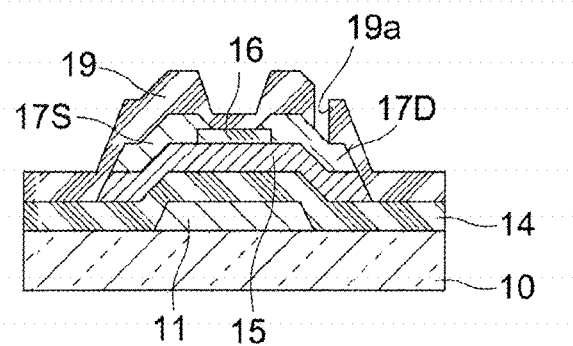
Figure 3D:
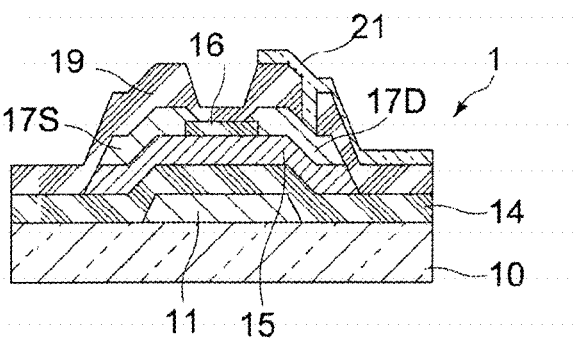

FIG. 1 is a schematic cross-sectional view showing a configuration of a thin-film transistor according to an embodiment of the present invention. In this embodiment, a so-called bottom-gate field effect transistor will be described as an example.

Configuration of Thin-Film Transistor

A thin-film transistor 1 according to this embodiment includes a gate electrode 11, an active layer 15, a gate insulating film 14, a source electrode 17S, and a drain electrode 17D.

The gate electrode 11 is formed of a conductive film formed on the surface of a substrate 10. The substrate 10 is typically a transparent glass substrate. The gate electrode 11 is typically formed of a metal single-layer film of molybdenum (Mo), titanium (Ti), aluminum (Al), copper (Cu), or the like, or a metal multilayer film thereof, and formed by a sputtering method, for example. In this embodiment, the gate electrode 11 is formed of molybdenum. The thickness of the gate electrode 11 is not particularly limited, and is, for example, 300 nm.

The active layer 15 functions as a channel layer of the transistor 1. The film thickness of the active layer 15 is, for example, 30 nm to 200 nm. The active layer 15 is formed of an oxide semiconductor film (hereinafter, referred to also as In—Ti—Zn—O film) containing indium (In), zinc (Zn), and titanium (Ti).

Atomic proportions of elements relative to the total quantity of In, Zn, and Ti that constitute the oxide semiconductor film are not particularly limited, and are not less than 24 at. % and not more than 80 at. % for In, not less than 16 at. % and not more than 70 at. % for Zn, and not less than 0.1 at. % and not more than 20 at. % for Ti in this embodiment. Accordingly, it is possible to achieve transistor characteristics of a mobility of not less than 15 cm$^2$/Vs and an on/off current ratio of eight not less than 8 digits.

Further, by setting the atomic proportions of the elements to not less than 39.5 at. % and not more than 56.5 at. % for indium, not less than 39 at. % and not more than 56 at. % for zinc, and not less than 0.5 at. % and not more than 10 at. % for titanium, it is possible to achieve transistor characteristics of a mobility of not less than 28 cm$^2$/Vs and an on/off current ratio of eight not less than 10 digits.

Further, it is preferable that the carrier concentration of the oxide semiconductor film suitable for the active layer 15 is, for example, not more than $1 \times 10^{18}$/cm$^3$. When the carrier concentration exceeds $1 \times 10^{18}$/cm$^3$, the on/off current ratio becomes not more than 6 digits, and it may be difficult to obtain stable switching characteristics. By setting the carrier concentration of the oxide semiconductor film constituting the active layer 15 to not more than $1 \times 10^{18}$/cm$^3$, it is possible to stably secure transistor characteristics of a mobility of not less than 15 cm$^2$/Vs and an on/off current ratio of eight not less than 8 digits.

As described later in detail, the active layer 15 is formed by performing deposition using a sputtering target formed of a sintered body of oxides of In, Zn, and Ti, and then heat-treating (annealing) it at a predetermined temperature. By sputtering the target under predetermined conditions, an oxide semiconductor film having the same or substantially the same composition as that of the target is formed. By annealing this semiconductor film at a predetermined temperature, an active layer that expresses transistor characteristics of, for example, a mobility of not less than 15 cm$^2$/Vs and an on/off current ratio of eight not less than 8 digits is formed.

The gate insulating film 14 is formed between the gate electrode 11 and the active layer 15. The gate insulating film 14 is formed of a silicon oxide film (SiOx), a silicon nitride film (SiNx), or the like, but is not limited thereto, and it can be formed by using various electric insulating films such as a metal oxide film. The deposition method is not particularly limited, and a CVD method, a sputtering method, a vapor deposition method, or the like may be used. The film thickness of the gate insulating film 14 is not particularly limited, and is, for example, 200 nm to 400 nm.

The source electrode 17S and the drain electrode 17D are formed apart from each other on/the active layer 15. The source electrode 17S and the drain electrode 17D can be formed of, for example, a metal single-layer film of aluminum, molybdenum, copper, titanium, or the like, or a metal multilayer film of these metals. As will be described later, the source electrode 17S and the drain electrode 17D can be formed at the same time by patterning a metal film. The thickness of the metal film is, for example, 100 nm to 500 nm.

On the active layer 15, an etching stopper layer 16 is formed. The etching stopper layer 16 is provided to protect the active layer 15 from an etchant when pattern-etching the source electrode 17S and the drain electrode 17D. The etching stopper layer 16 can be formed of, for example, a silicon oxidized film, a silicon nitride film, or a stacked film thereof.

The source electrode 17S and the drain electrode 17D are covered with a protection film 19. The protection film 19 is formed of, for example, an electrically insulating material such as a silicon oxidized film, a silicon nitride film, or a stacked film thereof. The protection film 19 is for shielding the device parts including the active layer 15 from outside air. The film thickness of the protection film 19 is not particularly limited, and is, for example, 200 nm to 500 nm. In the protection film 19, an interlayer connection hole for connecting the source/drain electrodes 17S and 17D to a wiring layer 21 is provided at an appropriate position. The wiring layer 21 is for connecting the transistor 1 to a peripheral circuit (not shown), and formed of a transparent conductive film such as ITO.

Method of Producing Thin-Film Transistor

Next, a method of producing the thin-film transistor 1 configured as described above according to this embodiment will be described. FIGS. 2A-2E and FIGS. 3A-3D are each a cross-sectional view of main portions of each process for describing a method of producing the thin-film transistor 1.

First, as shown in Part A of FIG. 2, the gate electrode 11 is formed on a surface of the substrate 10. The gate electrode 11 is formed by patterning a gate electrode film formed on the surface of the substrate 10 into a predetermined shape.

Next, as shown in Part B of FIG. 2, the gate insulating film 14 is formed on the surface of the substrate 10 so as to cover the gate electrode 11. The thickness of the gate insulating film 14 is, for example, 200 nm to 500 nm.

Next, as shown in Part C of FIG. 2, a thin film having an In—Ti—Zn—O-based composition (hereinafter, referred to simply as "In—Ti—Zn—O film") 15F is formed on the gate insulating film 14.

The In—Ti—Zn—O film 15F is formed by a sputtering method. As the sputtering target, a sintered body containing oxides of In, Zn, and Ti is used. By sputtering this target in an atmosphere of, for example, a mixed gas of argon (Ar) and oxygen ($O_2$), the In—Ti—Zn—O film 15F is formed.

The sputtering conditions are not particularly limited, and, for example, the pressure (total pressure) in a deposition chamber is controlled within the range of 0.1 to 5 Pa. The deposition may be performed while the substrate 10 is heated to a predetermined temperature or in a non-heated state. The temperature of the substrate 10 is, for example, room temperature to 300° C. Under these conditions, the In—Ti—Zn—O film 15F is formed by a pulse DC sputtering method.

Note that the atmosphere during the sputtering is not particularly limited, and the sputtering may be performed in an atmosphere of only argon without introducing oxygen. Further, the discharge method of sputtering is not limited to DC discharge, and AC discharge, RF discharge, or the like may be performed.

Atomic proportions of elements relative to the total quantity of In, Zn, and Ti that constitute the sintered body are not particularly limited, and are not less than 24 at. % and not more than 80 at. % for In, not less than 16 at. % and not more than 70 at. % for Zn, and not less than 0.1 at. % and not more than 20 at. % for Ti in this embodiment. Accordingly, it is possible to form the active layer 15 having transistor characteristics of a mobility of not less than 15 cm$^2$/Vs and an on/off current ratio of eight not less than 8 digits.

Further, by setting the atomic proportions of the elements to not less than 39.5 at. % and not more than 56.5 at. % for indium, not less than 39 at. % and not more than 56 at. % for zinc, and not less than 0.5 at. % and not more than 10 at. % for titanium, it is possible to achieve transistor characteristics of a mobility of not less than 28 cm$^2$/Vs and an on/off current ratio of eight not less than 10 digits.

The sputtering target can be formed of a sintered body obtained by mixing oxides of In, Zn, and Ti, such as $In_2O_3$, $TiO_2$, and ZnO, as raw material powder at the above-mentioned composition ratio.

According to this embodiment, by forming a sputtered film under the sputtering conditions described above, the obtained sputtered film has the same or substantially the same composition as that of the target.

An oxide semiconductor film deposited by sputtering the target having a component ratio defined as described above itself cannot achieve predetermined transistor characteristics. In view of the above, as will be described later in detail, by annealing (heat treatment) the deposited oxide semiconductor film in a predetermined temperature range, relaxation of the structure the oxide semiconductor film is promoted, and necessary transistor characteristics can be expressed.

Next, as shown in Part D of FIG. 2, the etching stopper layer 16 is formed on the In—Ti—Zn—O film 15F. The etching stopper layer 16 functions as an etching protection layer that protects the channel region of the In—Ti—Zn—O film from the etchant in the step of patterning a metal film constituting the source electrode and the drain electrode and the step of etching away an unnecessary region of the In—Ti—Zn—O film 15F, which will be described later.

The etching stopper layer 16 is formed of, for example, a silicon oxidized film, a silicon nitride film, or a stacked film thereof. The etching stopper layer 16 is formed by, for example, patterning a silicon oxidized film deposited on the In—Ti—Zn—O film 15F into a predetermined shape. The film thickness of the etching stopper layer 16 is not particularly limited, and is, for example, 30 nm to 300 nm.

Next, as shown in Part E of FIG. 2, a metal film 17F is formed so as to cover the In—Ti—Zn—O film 15F and the etching stopper layer 16. The metal film 17F is typically formed of a metal single-layer film of molybdenum, titanium, aluminum, copper, or the like, or a metal multilayer film thereof, and formed by a sputtering method, for example. The thickness of the metal film 17F is not particularly limited, and is, for example, 100 nm to 500 nm.

Next, as shown in Part A and Part B of FIG. 3, the metal film 17F is patterned. The patterning step of the metal film 17F includes a step of forming a resist mask 18 and a step of etching the metal film 17F. As shown in Part A of FIG. 3, the resist mask 18 has a mask pattern that opens a region right above the etching stopper layer 16 and a peripheral region of each transistor. After forming the resist mask 18, the metal film 17F is etched by a wet etching method. Accordingly, the metal film 17F is separated into the source electrode 17S and the drain electrode 17D that are electrically connected to the active layer 15 (Part B of FIG. 3).

In the step of forming the source electrode 17S and the drain electrode 17D, the etching stopper layer 16 has a function of protecting the In—Ti—Zn—O film 15 from an etchant (e.g., a mixed solution of phosphoric acid, nitric acid, and acetic acid) applied to the metal film 17F. Therefore, the etching stopper layer 16 is formed so as to cover the region of the In—Ti—Zn—O film 15F between the source electrode 17S and the drain electrode 17D (hereinafter, referred to as "channel region"). Therefore, the channel region of the In—Ti—Zn—O film 15F is not affected by the step of etching the metal film 17F.

Next, In—Ti—Zn—O film 15F is etched using the resist mask 18 shown in Part A of FIG. 3 as a mask. The etching method is not particularly limited, and a wet etching method or a dry etching method may be used. By this step of etching the In—Ti—Zn—O film 15F, the In—Ti—Zn—O film 15F is isolated in device units, and the active layer 15 formed of the In—Ti—Zn—O film 15F is formed (Part B of FIG. 3).

At this time, the etching stopper layer 16 functions as an etching protection film of the In—Ti—Zn—O film 15 located in the channel region. Specifically, the etching stopper layer 16 has a function of protecting the channel region located immediately below the etching stopper layer 16 from an etchant (e.g., oxalic acid) applied to the In—Ti—

Zn—O film 15F. Accordingly, the channel region of the active layer 15 is not affected by the step of etching the In—Ti—Zn—O film 15F.

After patterning the In—Ti—Zn—O film 15F, the resist mask 18 is removed from the source electrode 17S and the drain electrode 17D by ashing treatment or the like.

Further, an annealing step (heat treatment) for relaxing the structure of oxide semiconductor film constituting the active layer 15 is performed. Note that the relaxing of the structure represents to compensate for electrical and structural defects of the oxide semiconductor film after the deposition. Accordingly, it is possible to improve the transistor characteristics of the active layer 15.

The annealing step is performed at a temperature of not less than 200° C. and not more than 600° C. in the atmosphere. Accordingly, it is possible to produce the thin-film transistor 1 having an on/off current ratio of not less than eight digits. When the annealing temperature is lower than 200° C., the effect of relaxing the structure of the active layer 15 cannot be promoted, and it is difficult to secure an on/off current ratio of not less than eight digits. Further, when the annealing temperature exceeds 600° C., material restrictions may occur in the substrate 10 or various functional films formed on the substrate 10 from the viewpoint of heat resistance.

Note that in the step of annealing the active layer 15, the treatment atmosphere is not limited to the atmosphere, and may be substituted with nitrogen ($N_2$) under the atmospheric pressure, to which oxygen ($O_2$) may be added. Further, the pressure of the treatment atmosphere is not limited to the atmospheric pressure, and may be a reduced pressure atmosphere.

Next, as shown in Part C of FIG. 3, the protection film (passivation film) 19 is formed on the surface of the substrate 10 so as to cover the source electrode 17S, the drain electrode 17D, the stopper layer 16, the active layer 15, and the gate insulating film 14.

The protection film 19 is for securing predetermined electrical and material characteristics by shielding the transistor device including the active layer 15 from outside air. The protection film 19 is typically formed of an oxidized film or a nitride film such as a silicon oxidized film and a silicon nitride film, or a stacked film thereof, and is formed by, for example, a CVD method or a sputtering method. The thickness of the protection film 19 is not particularly limited, and is, for example, 200 nm to 500 nm.

Next, as shown in Part C of FIG. 3, a contact hole 19a that communicates with the source/drain electrodes is formed in the protection film 19. This step includes a step of forming a resist mask on the protection film 19, a step of etching the protection film 19 exposed from an opening of the resist mask, and a step of removing the resist mask.

Although a dry etching method is adopted for forming the contact hole 19a, a wet etching method may be adopted. Further, although not shown in the drawing, a contact hole that communicates with the source electrode 17S at an arbitrary position is similarly formed.

Next, as shown in Part D of FIG. 3, a transparent conductive film 21 that contacts the source/drain electrodes via the contact hole 19a and functions as a wiring layer is formed. This step includes a step of forming the transparent conductive film 21, a step of forming a resist mask on the transparent conductive film 21, a step of etching the transparent conductive film 21 that is not covered with the resist mask, and a step of removing the resist mask.

The transparent conductive film 21 is typically formed of an ITO film or an IZO film, and is formed by, for example, a sputtering method or a CVD method. A wet etching method is adopted for etching the transparent conductive film 21. However, it does not necessarily need to adopt a wet etching method, and a dry etching method may be adopted.

After that, an annealing step (heat treatment) for reducing the resistance of the transparent conductive film 21 is performed on the thin-film transistor 1 in which the transparent conductive film 21 is formed shown in Part D of FIG. 3.

The annealing step is performed, for example, at a temperature of about 200° C. in the atmosphere. Note that the target of this annealing step is not limited to the transparent conductive film 21, and heating and atmosphere conditions can be appropriately changed in this annealing step so that an effect of compensating electrical and structural defects can be obtained for the lower layers, i.e., the protection film 19, the active layer 15, and the like.

In the thin-film transistor 1 configured as described above according to this embodiment, constant forward direction voltage (source-drain voltage: Vds) is applied between the source electrode 17S and the drain electrode 17D. By applying gate voltage (Vgs) of not less than threshold value voltage (Vth) between the gate electrode 11 and the source electrode 17S in this state, carriers (electrons, electron holes) are generated in the active layer 15, and current (source-drain current: Ids) is generated between the source and the drain by the forward voltage between the source and the drain. As the gate voltage is increased, the source-drain current (Ids) is also increased.

The source-drain current at this time is also called on-state current, and a larger current value can be obtained as the mobility of the thin-film transistor 1 is higher. In this embodiment, since the active layer 15 of the thin-film transistor 1 is formed of an In—Ti—Zn—O film, a mobility higher than that of a thin-film transistor using an active layer formed of an IGZO film can be achieved. Therefore, according to this embodiment, it is possible to obtain a field effect transistor having a high on-state current value.

Meanwhile, in the case where voltage applied to the gate electrode 11 is smaller than threshold value voltage (Vth), the current generated between the source and the drain is substantially zero. The source-drain current at this time is also called off-state current. As the off-state current value is smaller, the ratio of the on-state current value to the off-state current value (on-off current ratio) becomes larger, so that favorable characteristics are obtained as a transistor.

Figure 4:
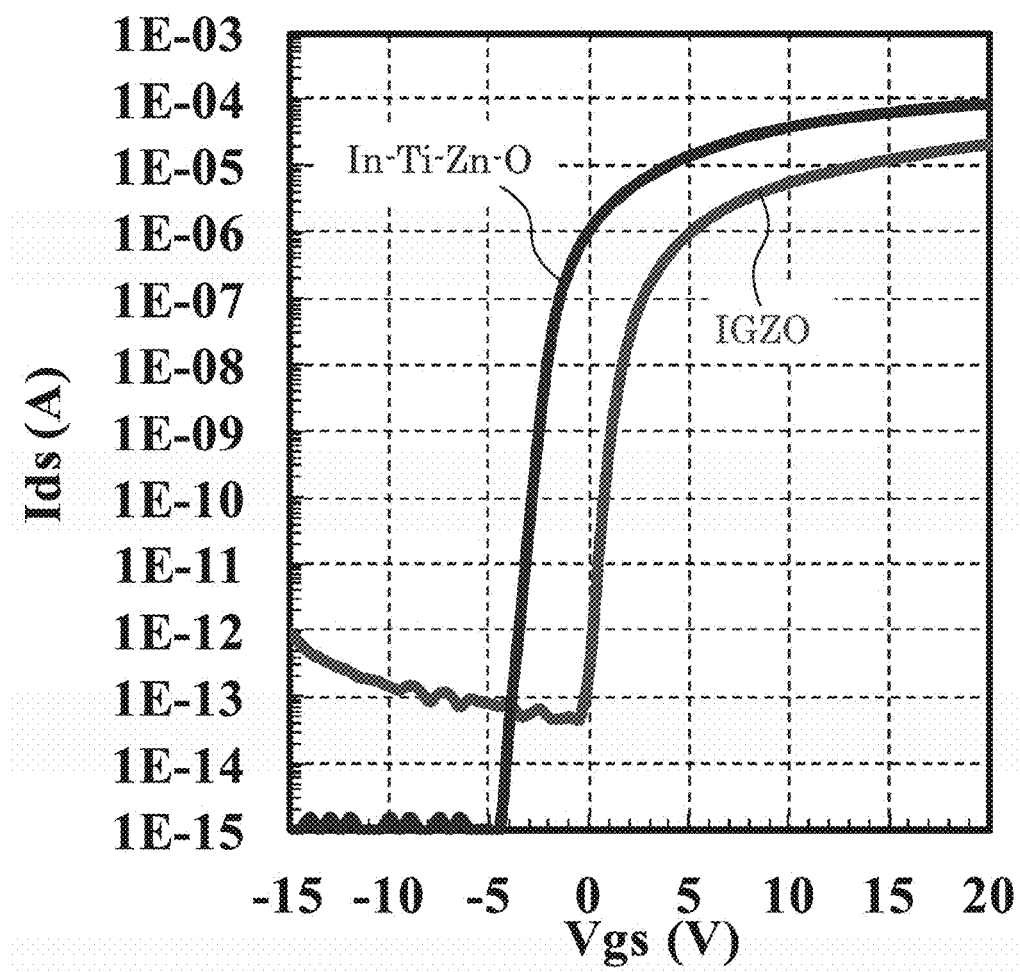
FIG. 4 An experimental result showing current characteristics of the thin-film transistor.

FIG. 4 is an experimental result showing an example of transfer characteristics of a thin-film transistor using, as an active layer, the In—Ti—Zn—O film that is annealed for one hour in the atmosphere at 400° C. after deposition and patterning, and shows the relationship between the gate voltage (Vgs) the source-drain current (Ids) when the source-drain voltage (Vds) is 5 V. In the obtained results, the ratio of the obtained on-state current to the obtained off-state current was calculated using Ids when Vgs is −15 V as the off-state current and Ids when Vgs is +20 V as the of-state current, thereby obtaining the on/off current ratio.

Further, for comparison, an example of transfer characteristics of a thin-film transistor using a typical IGZO film for an active layer is also shown in FIG. 4. The IGZO film is obtained by depositing a sputtering target formed of an IGZO sintered body having a composition ratio of In:Ga:Zn=1:1:1 in an atmosphere of a mixed gas of argon and oxygen under sputtering conditions of the pressure (total pressure) in a deposition chamber of 0.3 Pa and an oxygen concentration of 7% by a pulse DC sputtering method, and then annealing it in the atmosphere at 400° C.

Characteristic Evaluation

As shown in FIG. 4, when evaluating transfer characteristics of a thin-film transistor using an In—Ti—Zn—O film as an active layer, the on/off current ratio is confirmed to be higher than that of a thin-film transistor using an IGZO film. Further, the mobility of the thin-film transistor using an IGZO film as an active layer was 10 cm$^2$/Vs, while the mobility of the thin-film transistor using an In—Ti—Zn—O film was 30 cm$^2$/Vs.

Figure 5:
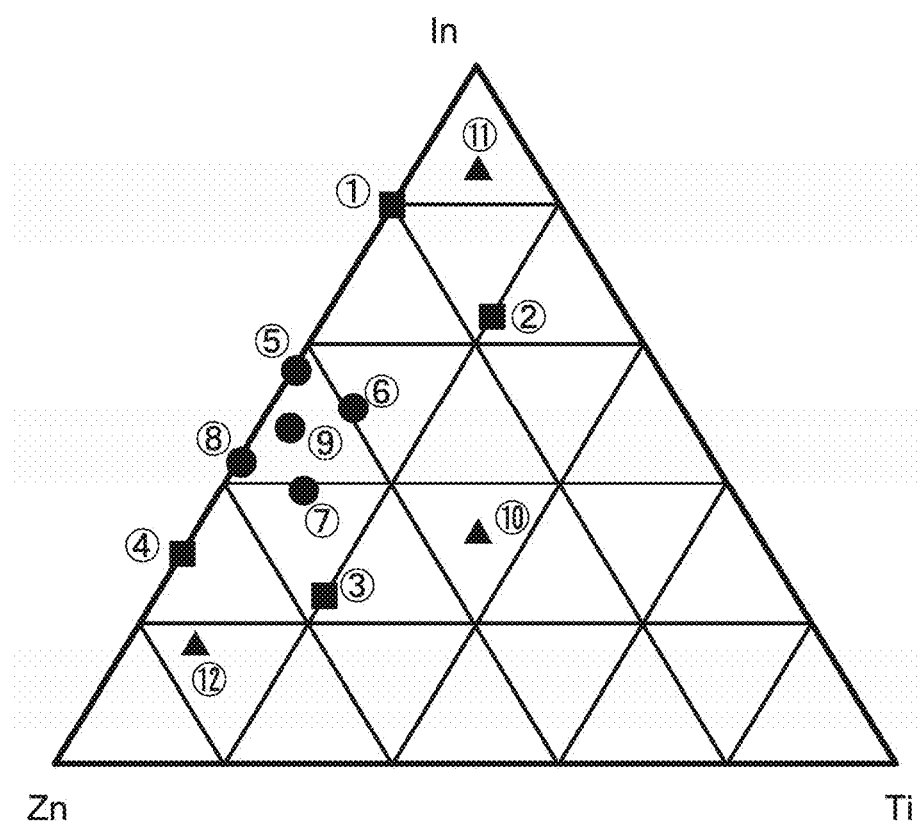
FIG. 5 A ternary state diagram of In—Zn—Ti showing a composition range of In—Ti—Zn—O film (or In—Ti—Zn—O target) in which a mobility of not less than 5 cm$^2$/Vs and an on/off current ratio of not less than six digits are obtained.

Note that in the sputtering target used for depositing the In—Ti—Zn—O film at this time, atomic proportions of elements relative to the total quantity of In, Zn, and Ti that constitute the target were In=48.0%, Zn=48.0%, Ti=4%. This composition ratio corresponds to a sample 9 to be described later (FIG. 5, Table 1).

Meanwhile, the present inventors prepared a plurality of In—Ti—Zn—O targets having different composition ratios (component ratios), prepared thin-film transistors that have the structure shown in FIG. 1 and use In—Ti—Zn—O films obtained by sputtering the plurality of targets under the above-mentioned conditions as active layers, and evaluated transfer characteristics (mobility, on/off current ratio) of the thin-film transistors. The annealing conditions of each In—Ti—Zn—O film were 400° C. in the atmosphere and one hour.

The mobility and the on/off current ratio of each sample were evaluated by the same way as that for an example (sample 9) shown in FIG. 4. In addition, the carrier concentration of each In—Ti—Zn—O film was measured using a Hall effect measuring device.

(Sample 1)

An In—Ti—Zn—O sintered body in which atomic proportions of elements relative to the total quantity of In, Zn, and Ti are In: 80 at. %, Zn: 19.9 at. %, Ti: 0.1 at. % was used as an In—Ti—Zn—O target to prepare a sputtering target. As a result of evaluating transfer characteristics of a thin-film transistor having an active layer formed of an oxide semiconductor film deposited by sputtering the In—Ti—Zn—O target, the mobility was 42 cm$^2$/Vs, and the on/off current ratio (On/Off ratio) was eight digits. Further, when measuring the carrier concentration of the oxide semiconductor film, it was not more than 1E18 (1×10$^{18}$)/cm$^3$.

(Sample 2)

An In—Ti—Zn—O sintered body in which atomic proportions of elements relative to the total quantity of In, Zn, and Ti are In: 64 at. %, Zn: 16 at. %, Ti: 20 at. % was used as an In—Ti—Zn—O target to prepare a sputtering target. As a result of evaluating transfer characteristics of a thin-film transistor having an active layer formed of an oxide semiconductor film deposited by sputtering the In—Ti—Zn—O target, the mobility was 38 cm$^2$/Vs, and the on/off current ratio (On/Off ratio) was eight digits. Further, when measuring the carrier concentration of the oxide semiconductor film, it was not more than 1E18 (1×10$^{18}$)/cm$^3$.

(Sample 3)

An In—Ti—Zn—O sintered body in which atomic proportions of elements relative to the total quantity of In, Zn, and Ti are In: 24 at. %, Zn: 56 at. %, Ti: 20 at. % was used as an In—Ti—Zn—O target to prepare a sputtering target. As a result of evaluating transfer characteristics of a thin-film transistor having an active layer formed of an oxide semiconductor film deposited by sputtering the In—Ti—Zn—O target, the mobility was 15 cm$^2$/Vs, and the on/off current ratio (On/Off ratio) was 10 digits. Further, when measuring the carrier concentration of the oxide semiconductor film, it was not more than 1E18 (1×10$^{18}$)/cm$^3$.

(Sample 4)

An In—Ti—Zn—O sintered body in which atomic proportions of elements relative to the total quantity of In, Zn, and Ti are In: 30 at. %, Zn: 69.9 at. %, Ti: 0.1 at. % was used as an In—Ti—Zn—O target to prepare a sputtering target. As a result of evaluating transfer characteristics of a thin-film transistor having an active layer formed of an oxide semiconductor film deposited by sputtering the In—Ti—Zn—O target, the mobility was 20 cm$^2$/Vs, and the on/off current ratio (On/Off ratio) was 10 digits. Further, when measuring the carrier concentration of the oxide semiconductor film, it was not more than 1E18 (1×10$^{18}$)/cm$^3$.

(Sample 5)

An In—Ti—Zn—O sintered body in which atomic proportions of elements relative to the total quantity of In, Zn, and Ti are In: 56.5 at. %, Zn: 43 at. %, Ti: 0.5 at. % was used as an In—Ti—Zn—O target to prepare a sputtering target. As a result of evaluating transfer characteristics of a thin-film transistor having an active layer formed of an oxide semiconductor film deposited by sputtering the In—Ti—Zn—O target, the mobility was 38 cm$^2$/Vs, and the on/off current ratio (On/Off ratio) was 10 digits. Further, when measuring the carrier concentration of the oxide semiconductor film, it was not more than 1E17 (1×10$^{17}$)/cm$^3$.

(Sample 6)

An In—Ti—Zn—O sintered body in which atomic proportions of elements relative to the total quantity of In, Zn, and Ti are In: 51 at. %, Zn: 39 at. %, Ti: 10 at. % was used as an In—Ti—Zn—O target to prepare a sputtering target. As a result of evaluating transfer characteristics of a thin-film transistor having an active layer formed of an oxide semiconductor film deposited by sputtering the In—Ti—Zn—O target, the mobility was 34 cm$^2$/Vs, and the on/off current ratio (On/Off ratio) was 10 digits. Further, when measuring the carrier concentration of the oxide semiconductor film, it was not more than 1E17 (1×10$^{17}$)/cm$^3$.

(Sample 7)

An In—Ti—Zn—O sintered body in which atomic proportions of elements relative to the total quantity of In, Zn, and Ti are In: 39.5 at. %, Zn: 50.5 at. %, Ti: 10 at. % was used as an In—Ti—Zn—O target to prepare a sputtering target. As a result of evaluating transfer characteristics of a thin-film transistor having an active layer formed of an oxide semiconductor film deposited by sputtering the In—Ti—Zn—O target, the mobility was 28 cm$^2$/Vs, and the on/off current ratio (On/Off ratio) was 10 digits. Further, when measuring the carrier concentration of the oxide semiconductor film, it was not more than 1E17 (1×10$^{17}$)/cm$^3$.

(Sample 8)

An In—Ti—Zn—O sintered body in which atomic proportions of elements relative to the total quantity of In, Zn, and Ti are In: 43.5 at. %, Zn: 56 at. %, Ti: 0.5 at. % was used as an In—Ti—Zn—O target to prepare a sputtering target. As a result of evaluating transfer characteristics of a thin-film transistor having an active layer formed of an oxide semiconductor film deposited by sputtering the In—Ti—Zn—O target, the mobility was 34 cm$^2$/Vs, and the on/off current ratio (On/Off ratio) was eight digits. Further, when measuring the carrier concentration of the oxide semiconductor film, it was not more than 1E17 (1×10$^{17}$)/cm$^3$.

(Sample 9)

An In—Ti—Zn—O sintered body in which atomic proportions of elements relative to the total quantity of In, Zn, and Ti are In: 48 at. %, Zn: 48 at. %, Ti: 4 at. % was used as an In—Ti—Zn—O target to prepare a sputtering target. As a result of evaluating transfer characteristics of a thin-film transistor having an active layer formed of an oxide semiconductor film deposited by sputtering the In—Ti—Zn—O target, the mobility was 30 cm²/Vs, and the on/off current ratio (On/Off ratio) was eight digits. Further, when measuring the carrier concentration of the oxide semiconductor film, it was not more than 1E17 (1×10¹⁷)/cm³.

(Sample 10)

An In—Ti—Zn—O sintered body in which atomic proportions of elements relative to the total quantity of In, Zn, and Ti are In: 33.3 at. %, Zn: 33.3 at. %, Ti: 33.4 at. % was used as an In—Ti—Zn—O target to prepare a sputtering target. As a result of evaluating transfer characteristics of a thin-film transistor having an active layer formed of an oxide semiconductor film deposited by sputtering the In—Ti—Zn—O target, the mobility was 10 cm²/Vs, and the on/off current ratio (On/Off ratio) was eight digits. Further, when measuring the carrier concentration of the oxide semiconductor film, it was not more than 1E16 (1×10¹⁶)/cm³.

(Sample 11)

An In—Ti—Zn—O sintered body in which atomic proportions of elements relative to the total quantity of In, Zn, and Ti are In: 85 at. %, Zn: 7 at. %, Ti: 8 at. % was used as an In—Ti—Zn—O target to prepare a sputtering target. As a result of evaluating transfer characteristics of a thin-film transistor having an active layer formed of an oxide semiconductor film deposited by sputtering the In—Ti—Zn—O target, the mobility was 50 cm²/Vs, and the on/off current ratio (On/Off ratio) was six digits. Further, when measuring the carrier concentration of the oxide semiconductor film, it was not more than 1E19 (1×10¹⁹)/cm³.

(Sample 12)

An In—Ti—Zn—O sintered body in which atomic proportions of elements relative to the total quantity of In, Zn, and Ti are In: 17 at. %, Zn: 75 at. %, Ti: 8 at. % was used as an In—Ti—Zn—O target to prepare a sputtering target. As a result of evaluating transfer characteristics of a thin-film transistor having an active layer formed of an oxide semiconductor film deposited by sputtering the In—Ti—Zn—O target, the mobility was 5 cm²/Vs, and the on/off current ratio (On/Off ratio) was eight digits. Further, when measuring the carrier concentration of the oxide semiconductor film, it was not more than 1E16 (1×10¹⁶)/cm³.

(Sample 13)

An IGZO sintered body having the component ratio of In:Ga:Zn=1:1:1 was used as an IGZO target to prepare a sputtering target. The IGZO target was sputtered in an atmosphere of a mixed gas of argon and oxygen under conditions of the pressure (total pressure) in a deposition chamber of 0.3 Pa and an oxygen concentration of 7% by a pulse DC sputtering method to prepare a thin-film transistor having an active layer formed of an oxide semiconductor film deposited thereby. The annealing condition of the active layer was 400° C. in the atmosphere and one hour. When evaluating transfer characteristics of this thin-film transistor, the mobility was 10 cm²/Vs, and the on/off current ratio (On/Off ratio) was seven digits. Further, when measuring the carrier concentration of the oxide semiconductor film, it was not more than 1E16 (1×10¹⁶)/cm³.

FIG. 5 shows a phase diagram (In—Zn—Ti-based ternary state diagram) indicating the composition ratios of elements of the samples 1 to 12, and Table 1 shows the composition ratios and transistor characteristics of the elements of the samples 1 to 13. Note that circled numbers in FIG. 5 represent sample numbers, black square plots show the samples 1 to 4, black circle plots show the samples 5 to 9, and black triangle plots show the samples 10 to 12.

TABLE 1

| No | Composition at % | | | Mobility cm²/Vs | On/Off ratio | Carrier concentration (/cm³) |
|---|---|---|---|---|---|---|
| | In | Zn | Ti | | | |
| 1 | 80 | 19.9 | 0.1 | 42 | 8 digits | ≤1E18 |
| 2 | 64 | 16 | 20 | 38 | 8 digits | ≤1E18 |
| 3 | 24 | 56 | 20 | 15 | 10 digits | ≤1E18 |
| 4 | 30 | 69.9 | 0.1 | 20 | 10 digits | ≤1E18 |
| 5 | 56.5 | 43 | 0.5 | 38 | 10 digits | ≤1E17 |
| 6 | 51 | 39 | 10 | 34 | 10 digits | ≤1E17 |
| 7 | 39.5 | 50.5 | 10 | 28 | 10 digits | ≤1E17 |
| 8 | 43.5 | 56 | 0.5 | 34 | 10 digits | ≤1E17 |
| 9 | 48 | 48 | 4 | 30 | 11 digits | ≤1E17 |
| 10 | 33.3 | 33.3 | 33.4 | 10 | 9 digits | ≤1E16 |
| 11 | 85 | 7 | 8 | 50 | 6 digits | ≤1E19 |
| 12 | 17 | 75 | 8 | 5 | 8 digits | ≤1E16 |
| 13 | IGZO (1:1:1) | | | 10 | 7 digits | ≤1E16 |

According to the thin-film transistors of the samples 1 to 12 in which an In—Ti—Zn—O film is used as an active layer, it was confirmed that transistor characteristics of the mobility of not less than 5 cm²/Vs and the on/off current ratio of not less than six digits could be obtained.

Further, according to the samples 1 to 9 in which atomic proportions of elements that constitute the In—Ti—Zn—O film were In: not less than 24 at. % and not more than 80 at. %, Zn: not less than 16 at. % and not more than 70 at. %, and Ti: not less than 0.1 at. % and not more than 20 at. %, it was confirmed that the mobility greater than 10 cm²/Vs (not less than 15 cm²/Vs), the on/off current ratio of not less than eight digits, and the carrier concentration of not more than 1E18(1×10¹⁸)/cm³ could be stably obtained. These were transistor characteristics higher than those of the thin-film transistor of the sample 13 in which an IGZO film was used as an active layer.

Further, according to the samples 5 to 9 in which atomic proportions of elements that constitute the In—Ti—Zn—O film were In: not less than 39.5 at. % and not more than 56.5 at. %, Zn: not less than 39 at. % and not more than 56 at. %, and Ti: not less than 0.5 at. % and not more than 10 at. %, it was confirmed that the mobility greater than 20 cm²/Vs (not less than 28 cm²/Vs), the on/off current ratio of not less than 10 digits, and the carrier concentration of not more than 1E17(1×10¹⁷)/cm³ could be stably obtained.

Meanwhile, although the sample 10 in which atomic proportions of elements that constitute the In—Ti—Zn—O film were In: 33.3 at. %, Zn: 33.3 at. %, Ti: 33.4 at. % had favorable values, i.e., the on/off current ratio of nine digits and the carrier concentration of not more than 1E16(1×10¹⁶)/cm³, the mobility thereof was 10 cm²/Vs, which was similar to that of the sample 13 using an IGZO film.

Further, although the sample 11 in which atomic proportions of elements that constitute the In—Ti—Zn—O film were In: 85 at. %, Zn: 7 at. %, Ti: 8 at. % had a high value, i.e., the mobility of 50 cm²/Vs, the carrier concentration thereof was not more than 1E19(1×10¹⁹)/cm³ and the on/off current ratio thereof was six digits, which causes a problem in the switching characteristics of the thin-film transistor.

Further, although the sample 12 in which atomic proportions of elements that constitute the In—Ti—Zn—O film were In: 17 at. %, Zn: 75 at. %, Ti: 8 at. % had favorable values of the on/off current ratio and the carrier concentration similarly to the sample 10, the mobility thereof was 5 cm²/Vs, which was inferior to that of the sample 13 using an IGZO film.

As described above, according to this embodiment, it is possible to provide a high-performance thin-film transistor instead of IGZO, an oxide semiconductor film used for an active layer thereof, and a sputtering target used for depositing the same.

Although an embodiment of the present invention has been described heretofore, the present invention is not limited to only the above-mentioned embodiment, and it goes without saying that various modifications can be made.

For example, although a so-called bottom-gate (inverted staggered) transistor has been described as an example in the above-mentioned embodiment, the present invention can be applied also to a top-gate (staggered) thin-film transistor.

Further, the above-mentioned thin-film transistor can be used as a TFT for an active matrix display panel such as a liquid crystal display and an organic EL display. Other than these, the above-mentioned transistor can be used as a transistor device of various semiconductor apparatuses or electronic apparatuses.

Further, although the metal components of In, Zn, and Ti have been described as constituent elements of the In—Ti—Zn—O-based oxide in the above-mentioned embodiment, other metal elements such as zirconium (Zr), hafnium (Hf), and yttrium (Y), or metal oxides thereof may be added.

DESCRIPTION OF REFERENCE NUMERALS 1 thin-film transistor
10 substrate
11 gate electrode
14 gate insulating film
15 active layer
15F In—Ti—Zn—O film
16 stopper layer
17S source electrode
17D drain electrode

The invention claimed is:

1. A bottom-gate type thin-film transistor, comprising:
a gate electrode;
an active layer formed of a single layer of an oxide semiconductor film containing indium, zinc, and titanium, atomic proportions of elements relative to the total quantity of indium, zinc, and titanium that constitute the oxide semiconductor film being not less than 39.5 at. % and not more than 56.5 at. % for indium, not less than 39 at. % and not more than 56 at. % for zinc, and not less than 0.5 at. % and not more than 10 at. % for titanium, the total of the atomic proportions of elements being 100 at. %;
a gate insulating film formed between the gate electrode and the active layer; and
a source electrode and a drain electrode that are electrically connected to the active layer,
wherein the thin-film transistor has a mobility of not less than 28 $cm^2$/Vs and an on/off current ratio of not less than ten digits.

* * * * *